(12) United States Patent
Smiley et al.

(10) Patent No.: US 7,107,186 B2
(45) Date of Patent: Sep. 12, 2006

(54) TRANSFORMER TESTING

(75) Inventors: Karen J. Smiley, Benson, NC (US); Thomas E. Long, Wake Forest, NC (US)

(73) Assignee: ABB Research Ltd., Zurich (CH)

( * ) Notice: Subject to any disclaimer, the term of this patent is extended or adjusted under 35 U.S.C. 154(b) by 28 days.

(21) Appl. No.: 10/698,276

(22) Filed: Oct. 31, 2003

(65) Prior Publication Data

US 2005/0096874 A1    May 5, 2005

(51) Int. Cl.
*G01R 31/06*    (2006.01)
(52) U.S. Cl. .............. 702/185; 702/182; 702/183; 702/184; 324/547
(58) Field of Classification Search ........ 702/182–185; 324/547
See application file for complete search history.

(56) References Cited

U.S. PATENT DOCUMENTS

| | | | | |
|---|---|---|---|---|
| 3,667,034 A * | 5/1972 | Freeze | ................ | 324/547 |
| 5,311,438 A | 5/1994 | Sellers et al. | ................ | 364/468 |
| 5,463,555 A | 10/1995 | Ward et al. | ................ | 364/468 |
| 5,629,870 A * | 5/1997 | Farag et al. | ................ | 700/286 |
| 5,835,764 A | 11/1998 | Platt et al. | ................ | 395/671 |
| 5,938,424 A * | 8/1999 | Kurogi et al. | ................ | 431/13 |
| 6,012,152 A * | 1/2000 | Douik et al. | ................ | 714/26 |
| 6,041,287 A * | 3/2000 | Dister et al. | ................ | 702/182 |
| 6,300,767 B1 * | 10/2001 | Kliman et al. | ................ | 324/536 |
| 6,324,523 B1 | 11/2001 | Killeen, Jr. et al. | ................ | 705/35 |
| 6,345,259 B1 | 2/2002 | Sandoval | ................ | 705/7 |
| 6,369,582 B1 * | 4/2002 | Coffeen | ................ | 324/547 |
| 6,477,521 B1 | 11/2002 | Kuomura et al. | ................ | 707/1 |
| 6,486,678 B1 * | 11/2002 | Spears | ................ | 324/555 |
| 6,633,772 B1 | 10/2003 | Ford et al. | ................ | 600/345 |
| 6,636,862 B1 | 10/2003 | Lundahal et al. | ................ | 707/101 |
| 2001/0042092 A1 | 11/2001 | Kudo et al. | ................ | 709/200 |
| 2002/0035498 A1 * | 3/2002 | Kehoe et al. | ................ | 705/8 |
| 2002/0143598 A1 | 10/2002 | Scheer | ................ | 705/9 |
| 2003/0172002 A1 * | 9/2003 | Spira et al. | ................ | 705/27 |
| 2004/0102928 A1 * | 5/2004 | Cuddihy et al. | ................ | 702/188 |
| 2004/0124860 A1 * | 7/2004 | Hamdan | ................ | 324/726 |
| 2004/0199573 A1 * | 10/2004 | Schwartz et al. | ................ | 709/201 |

FOREIGN PATENT DOCUMENTS

| | | |
|---|---|---|
| EP | 0 567 291 A2 | 10/1993 |
| EP | 0 721 625 B1 | 4/2002 |
| WO | WO 95/09387 | 4/1995 |
| WO | WO 98/57285 | 12/1998 |
| WO | WO 99/15979 | 4/1999 |
| WO | WO 01/02928 A2 | 1/2001 |
| WO | WO 01/50405 A1 | 7/2001 |

OTHER PUBLICATIONS

Aldred, K., "Aerospace Manufacturer takes off wit Paperless Manufacturing System", *IEEE Solutions*, 1998, 55-57.

(Continued)

*Primary Examiner*—Carol S. W. Tsai
(74) *Attorney, Agent, or Firm*—Woodcock Washburn LLP; Paul R. Katterle

(57) ABSTRACT

A method for transformer testing includes receiving a failing test result of a transformer, the test result being determined from a test taken during transformer manufacture, determining, via a knowledge-based system, a predicted root cause of the failure based on the test result and a knowledge base of transformer information, and determining, via the knowledge-based system, a suggested course of action for the failure based on the test result and the knowledge base of transformer information.

30 Claims, 6 Drawing Sheets

OTHER PUBLICATIONS

Chase, N., "Paperless Manufacturing Pays Off", *Quality*, Nov. 1998, 46-47.

deSpautz, J., "Quantifying the Benefits of Automation", *ISA Transactions*, 1994, 33, 107-112.

Eckerson, W., "Paperfree Factory gets Patriot Flying", *Network World*, 8(52), 2 pages.

Fouhy, k. et al., "Paperless Batch Plants become a Reality", *Chemical Engineering*, 1995, 31-33.

Fuller, L.F. et al., "A Joint Industry_university CIM Project for University Microelectronics Manufacturing", *IEEE*, 1991, 37-40.

Gould, L., "Data Collection Leads to Paperless Manufacturing", *Managing Automation*, May 1993, 48-49.

Jain, H.K. et al., "E-R Approach to Distributed Heterogeneous Database Systems for Integrated Manufacturing", *Information Resources Management Journal*, 1992, 3(1), 21-29.

Johanson, D.C. et al., "Application of a B&W Developed Computer Aided Pictorial Process Planning System to CQMS for Manufacturing Process", *Supercollider 4*, 1992, 513-516.

Haverson, D.S., RS/6000 Drives Paperless Manufacturing, *Applied Solutions*, 21-22.

Han, M.H. et al., "Flow Control in Flexible Manufacturing: Minimization of Stockout Cost", *Int. J. Prod. Res.*, 1989, 27(4), 701-715.

Lindo, W., "Workflow Management und Optimierung der Geschaftsprozesse", *ZWF*, 1996, 91, 419-420.

Naylor, A. W. et al., "Design of Integrated Manufacturing System Control Software", *IEEE Transactions on Systems, Man, and Cybernetics*, 1987, 17(6), 881-897.

Ram, S.N. et al., "Paperless Manufactruing for IC Assembly", *IEEE/SEMI Int'l Semiconductor Manufacturing Science Symposium*, 1992, 90-93.

Remson, M.G., "Paperless Manufacturing, A Challenge Now and in the Future", *IEEE/SEMI Int'l Semiconductor Manufacturing Science Symposium*, 1991, 89-94.

Saad, et al., "Effectiveness of Dynamic Rescheduling in Agent-Based Flexible Manufacturing Systems", *SPIE*, 3203, 88-99.

Vasilash, G.S., "Meeting the Future Head-on (Machinery Manufacturing)", *Production*, Jul. 1993, 50-55.

Vide, J.J. et al., "FMS Work Flow Optimization", *Proceedings of the 1986 Summer Computer Simulation Conference*, 1986, 705-710.

von Hardenberg, P.W. et al., "Use of Integrated Knowledge-Based Systems for Helicopter Design and Manufacturing", *American Helicopter Society 51st Annual Forum*, 1995, 1-10.

Shop Solutions-"Islands of Automation have Paperless Links", *Manufacturing Engineering*, 1997, 134-136.

"Revamping Manufacturing", *Computer-Aided Engineering*, 1995, 10-11.

Min-Hong, H., "Work Flow Control in Automated Manufacturing", Georgia Institute of Technology.

Dewhurst, F. et al., "Towards Integrated Manufacturing Planning with Common Tool and Information Sets", *International Journal of Operations & Production Management*, 2001, 21(11), 1460-1482.

Fung, R.Y.K. et al., "Adaptive Production Scheduling of Virtual Production Systems Using Object-Oriented Petri Nets with Changeable Structure", *Intl. J. Prod. Res.*, 2002, 40(8), 1759-1785.

Greenwell, R.M. et al., "Computer-aided Acquisition of Manufacturing Information", *Advances in Engineering Software*, 1994, 20, 1-12.

Guide, Jr., V.D.R. et al., "Rough-cut Capacity Planning for Remanufacturing Firms", *Production Planning & Control*, 1997, 8(3), 237-244.

Hitomi, K., "Strategic Integrated Manufacturing Systems: The Concept and Structures", *International Journal of Production of Economics*, 1991, 25, 5-12.

Jain, H.K. et al., "E-R Approach to Distributed Heterogeneous Database Systems for Integrated Manufacturing", *Information Resource Management Journal*, 1992, 3(1), 21-29.

Jean-Luc, G., "Automated Shop Floor Control System and Method of Operation Thereof", *Patents Alert*, 5530857, p. 87.

Naylor, A.W., et al., "Design of Integrated Manufacturing System Control Software", *IEEE Transactions on Systems, Man, and Cybernetics*, 1987, SMC17-(6), 881-897.

Oreshin, K.P. et al., "Integrated Multilevel System for Control of Production of the KAMAZ Work Complex", *Soviet Journal of Instrumentation and Control*, 1983, 4, 13-15.

Ouelhadj, D. et al., "A Multi-Contract Net Protocol for Dynamic Scheduling in Flexible Manufacturing Systems (FMS)", *Proceedings of the IEEE International Conference on Robotics & Automation*, 1999, 1114-1119.

Patkai, B., "A Cooperative Scheduling System for Paper Machinery Manufacturing", *IEEE*, 1998, 2518-2521.

Ramaswamy, S.E. et al., "Deadlock-Free Schedules for Automated Manufacturing Workstations", *IEEE Transactions on Robotics and Automation*, 1996, 12(3), 391-400.

Roberts, P.D. et al., A Coordination Strategy for Integrated Operations Management and Control, *Abstracts*, 091, p. 1071.

Saad, A. et al., "Effectiveness of Dynamic Rescheduling in Agent-Based Flexible Manufacturing Systems", *SPIE*, vol. 3203, 88-99.

Slomp, J. et al., "A Manufacturing Planning and Control System for a Flexible Manufacturing System", *Robotics & Computer-Integrated Manufacturing*, 1993, 10(1/2), 109-114.

Zhu, L. et al., "FMS Job-Shop Scheduling Under Disruptions with Consideration of Time and Sequence Deviation", *Proceedings of the IEEE International Symposium on Intelligent Control/Intelligent Systems and Semiotics*, 1999, 138-143.

"Integrated Manufacturing—A Challenge for the 1990s", ESPRIT Consortium AMICE, *Computing and Control Engineering Journal*, 1991, 101-102.

K. Kachigan, *Multivariate Statistical Analysis, A Conceptual Introduction*, 2nd Edition, 1991.

David G.T. Denison, et al., *Bayesian Methods for Nonlinear Classification and Regression*, 2002, John Wiley & Sons, Inc.

Cox, D., "Analyzing Transformer Test Data".

Geromel, L. H. et al., "The Application of Intelligent Systems in Power Transformer Design", *Proceedings of the 2002 IEEE Canadian Conference on Electrical & Computer Engineering*, 2002, 285-290.

Doulamis, N.D., et al., "A Synergetic Neural Network—Genetic Scheme for Optimal Transformer Construction", *Integrated Computer-Aided Engineering*, 2002, 9, 37-56.

Saravolac, M.P., "Use of Advance Software Techniques in Transformer Design", *The Institution of Electrical Engineers*, 1998, 1-11.

Balma, P.M. et al., "Expert Systems for Power Transformer Maintenance, Diagnostics, and Design Review", *Proceedings of the American Power Conference, 58th Annual Meeting*, 1996, 2, 963-967.

* cited by examiner

310

| Built Transformer Design Specification 450 | Built Transformer As-Built Information 460 | Built Transformer Test Measurement Information 470 | Built Transformer Manufacture Information 480 |

Figure 4

TRANSFORMER TESTING

CROSS-REFERENCE TO RELATED APPLICATIONS

This application is related to co-pending patent application Ser No. 10/699217, filed concurrently on Oct. 31, 2003, entitled "Method for Generating and Using a Transformer Model" (Attorney Docket: ABDT-0581/B030090), which is hereby incorporated by reference in its entirety. This application is related to co-pending patent application Ser. No. 10/699468, filed concurrently on Oct. 31, 2003, entitled "Method for Evaluating a Transformer Design" (Attorney Docket: ABDT-0582/B030080), which is hereby incorporated by reference in its entirety. This application is related to co-pending patent application Ser. No. 10/699467, filed concurrently on Oct. 31, 2003, entitled "Transformer Performance Prediction" (Attorney Docket: ABDT-0583/B030070), which is hereby incorporated by reference in its entirety.

FIELD OF THE INVENTION

The invention relates generally to transformer testing, and more particularly to using a knowledge-based system to assist troubleshooting transformer test failures occurring during transformer manufacture or related to transformer manufacture.

BACKGROUND OF THE INVENTION

Energy companies provide power to consumers via power generation units. The power is transmitted to consumers via a transmission and distribution system that may include power lines, power switches, and power transformers. The transmission and distribution system forms at least one, and possibly more, electrical paths between the generation units and power customers (e.g., homes, etc.).

Power transformers play an important role in the transmission and distribution of power. Power transformers form a critical link in the supply of power to customers. Failure of a power transformer often means power loss to a number of customers, therefore, transformer reliability is very important. In addition to transformer reliability, energy companies are typically very concerned with power transformer cost and efficiency.

To meet this market demand, transformer manufacturers attempt to design reliable and efficient power transformers. Power transformer design, however, is a very complex process. There are probably hundreds of design parameters that affect the cost and performance (e.g., reliability, efficiency, etc.) of a transformer.

Moreover, there are many manufacturing steps for a transformer, each of which could affect transformer performance. For example, if a transformer is manufactured on a piece of equipment that is out of calibration, it may fail to meet a performance specification. Because of the complexity of transformer design and manufacture, it is very difficult to troubleshoot the root cause of a test failure and to determine a solution to address the test failure.

Thus, there is a need for systems, methods, and the like, for efficiently troubleshooting transformer test failures.

SUMMARY OF THE INVENTION

A method for transformer testing includes receiving a failing test result of a transformer, the test result being determined from a test taken during transformer manufacture, determining, via a knowledge-based system, a predicted root cause of the failure based on the test result and a knowledge base of transformer information, and determining, via the knowledge-based system, a suggested course of action for the failure based on the test result and the knowledge base of transformer information.

The knowledge base of transformer information may include a transformer rule and transformer fact data. The transformer rule may include a transformer design rule and/or a transformer manufacture rule. The transformer fact data may include information representative of a plurality of built transformers, the built transformer information comprising a design specification for each built transformer, measured test results for each built transformer, as-built information for each built transformer, and/or built transformer manufacture information.

The method may determine the predicted root cause based on the test result, the knowledge base of transformer information, the transformer rule, the design specification for each built transformer, the measured test results for each built transformer, the as-built information for each built transformer, and/or the built transformer manufacture information. The method may determine the suggested course of action based on the test result, the knowledge base of transformer information, the transformer rule, the design specification for each built transformer, the measured test results for each built transformer, the as-built information for each built transformer, and/or the built transformer manufacture information.

The method may determine the predicted root cause and the suggested course of action by correlating the test result with the plurality of measured test results for each built transformer.

The method may refine the predicted root cause and the suggested course of action by receiving, from a user interface, additional information associated with the failed transformer, determining, via the knowledge-based system, a revised predicted root cause of the failure based on the test result, the knowledge base of transformer information, and the additional information, and determining, via the knowledge-based system, a revised suggested course of action for the failure based on the test result, the knowledge base of transformer information, and the additional information.

The predicted root cause may include a prediction that a piece of transformer manufacturing equipment is out of calibration, and the like. The suggested course of action may include a suggestion to modify a scheduled transformer manufacturing step to compensate for the test failure, a suggestion to redo a previously completed transformer manufacturing step, and the like.

A system for transformer testing includes a knowledge base, including transformer information, and an inference engine in communication with the knowledge base that is configured to perform: receiving a failing test result of a transformer, the test result being determined from a test taken during transformer manufacture, determining a predicted root cause of the failure based on the test result and a knowledge base of transformer information, and determining a suggested course of action for the failure based on the test result and the knowledge base of transformer information.

The inference engine may determine the predicted root cause based on the test result, the knowledge base of transformer information, the transformer rule, the design specification for each built transformer, the measured test results for each built transformer, the as-built information for each built transformer, and/or the built transformer manufacture information. The inference engine may determine the suggested course of action based on the test result, the knowledge base of transformer information, the transformer rule, the design specification for each built transformer, the measured test results for each built transformer, the as-built information for each built transformer, and/or the built transformer manufacture information.

The inference engine may determine the predicted root cause and the suggested course of action by correlating the test result with the plurality of measured test results for each built transformer.

The inference engine may refine the predicted root cause and the suggested course of action by receiving, from a user interface, additional information associated with the failed transformer, determining, via the knowledge-based system, a revised predicted root cause of the failure based on the test result, the knowledge base of transformer information, and the additional information, and determining, via the knowledge-based system, a revised suggested course of action for the failure based on the test result, the knowledge base of transformer information, and the additional information.

The predicted root cause may include a prediction that a piece of transformer manufacturing equipment is out of calibration, and the like. The suggested course of action may include a suggestion to modify a scheduled transformer manufacturing step to compensate for the test failure, a suggestion to redo a previously completed transformer manufacturing step, and the like.

BRIEF DESCRIPTION OF THE DRAWINGS

Systems and methods for transformer testing are further described with reference to the accompanying drawings in which:

FIG. 4 is a diagram showing details of a portion of the illustrative system of FIG. 3, in accordance with an embodiment of the invention;

DETAILED DESCRIPTION OF ILLUSTRATIVE EMBODIMENTS

Figure 1:
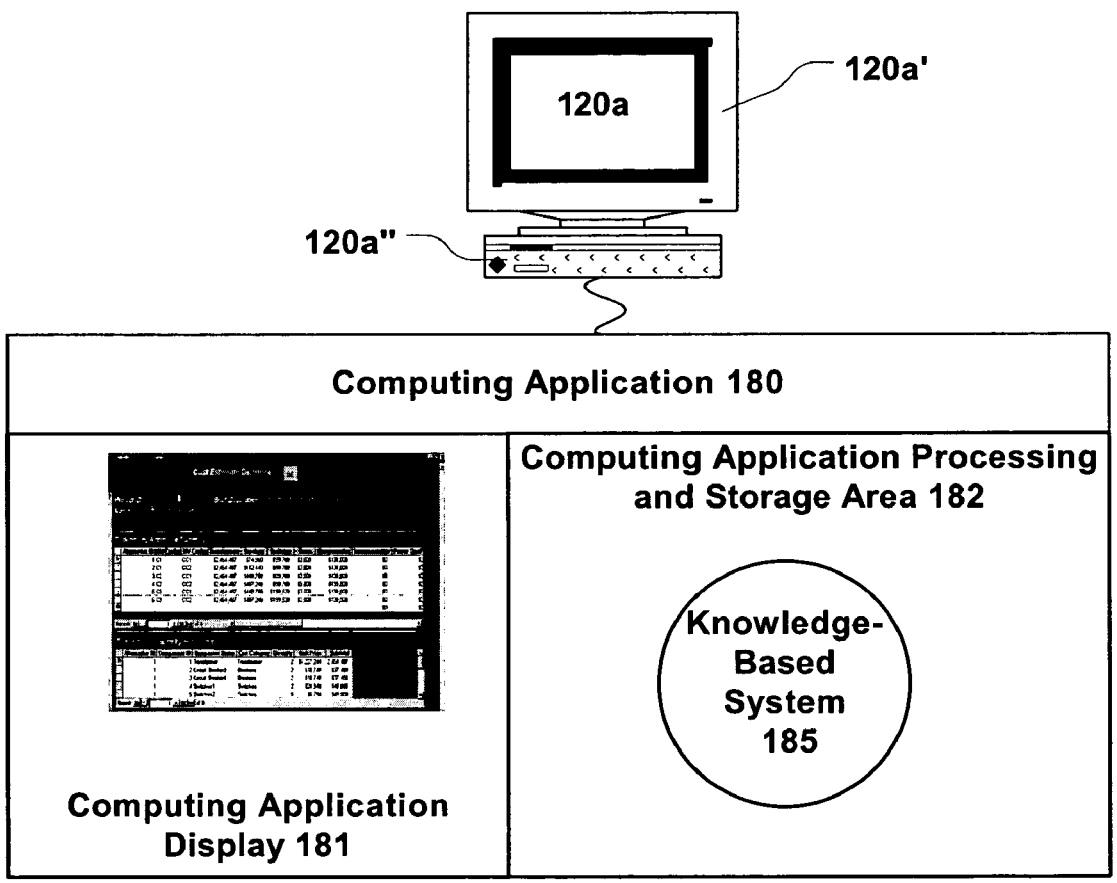
FIG. 1 is a diagram of an exemplary computing environment and an illustrative system for transformer testing, in accordance with an embodiment of the invention.

Transformer testing is implemented using a knowledge-based system to assist a user in troubleshooting transformer test failures occurring during transformer manufacture. The transformer manufacturing process typically is lengthy and complex. For example, the following steps may occur during a typical transformer manufacturing process: slitting steel, preparing high and low voltage bars, annealing high and low voltage bars, cutting core components, assembling the core, winding the core, fabricating the tank, painting the tank, filling the tank, and the like. Each of the manufacturing steps may be performed by manufacturing equipment, by plant operators, craftsmen, or some combination thereof. Variations at any step of the manufacturing process could potentially affect transformer performance. The variations could be caused by a variety of reasons, such as, for example, a piece of manufacturing equipment that is out of calibration, raw material that is out of specification, operator error, and the like.

Multiple tests may be performed during transformer manufacture (i.e., prior to field installation of the transformer). Some tests may be performed while the transformer is being assembled and other tests may be performed after the transformer has been completely assembled, but has not yet been installed in the field. (Tests could also be performed after the transformer has been field installed.) For example, the following tests may be performed on a transformer during transformer manufacture: a polarity test, a resistance test, an impedance test, a load loss test, a current transformer test, an impulse test, a core less test, a high-voltage test, a low-voltage test, a tank pressure test, a temperature test, a sound level test, a short circuit test, an interlock test, and the like.

Determining the cause of the test failure and a way to repair or rework the transformer to achieve a passing test result may be a very complex process. Typically, this responsibility may lie with an experienced transformer designer or a person experienced with the process of transformer manufacturing, or some combination thereof. Interactions between transformer design parameters and transformer manufacturing parameters may make it very difficult to determine the root cause of the test failure. The interactions may also make it difficult to determine a suggested way to address the failure.

The knowledge-based system may assist a user to determine the root cause of failure and to determine a suggested way to address the failure. The knowledge-based system may include an expert system that emulates the decision making ability of an expert in the field of transformer design and manufacture. Expert systems use knowledge (in the form of facts, rules, and the like) to make inferences based on that knowledge. The systems and methods for transformer testing may be implemented in one or more of the exemplary computing environments described in more detail below, or in other computing environments.

FIG. 1 shows computing system 120 that includes computer 120a. Computer 120a includes display device 120a' and interface and processing unit 120a". Computer 120a executes computing application 180. As shown, computing application 180 includes a computing application processing and storage area 182 and a computing application display 181. Computing application processing and storage area 182 includes knowledge-based system 185. Knowledge-based system 185 may implement systems and methods for transformer testing. Computing application display 181 may include display content which may be used for transformer testing and for user assistance with designing and manufacturing transformers. In operation, a user (not shown) may interface with computing application 180 through computer 120a. The user may navigate through computing application 180 to input, display, and generate data and information for transformer testing.

Computing application 180 may generate a predicted root cause of a test failure, such as, for example, a prediction that a piece of manufacturing equipment is out of calibration, a prediction that a raw material is out of specification, and the like. Computing application 180 may generate a suggestion for addressing the test failure, such as, for example, a suggestion to recalibrate the piece of manufacturing equipment, a suggestion to replace the core, a suggestion to modify the winding to compensate for a core test failure, and the like. Computing application 180 may generate a question for assistance in determining the predicted root cause and the suggestion for addressing the test failure, such as, for example, a question about the raw material, a question about the piece of manufacturing equipment, and the like. The prediction, suggestion, and question may be displayed to the user as display content via computing application display 181.

Figure 2:
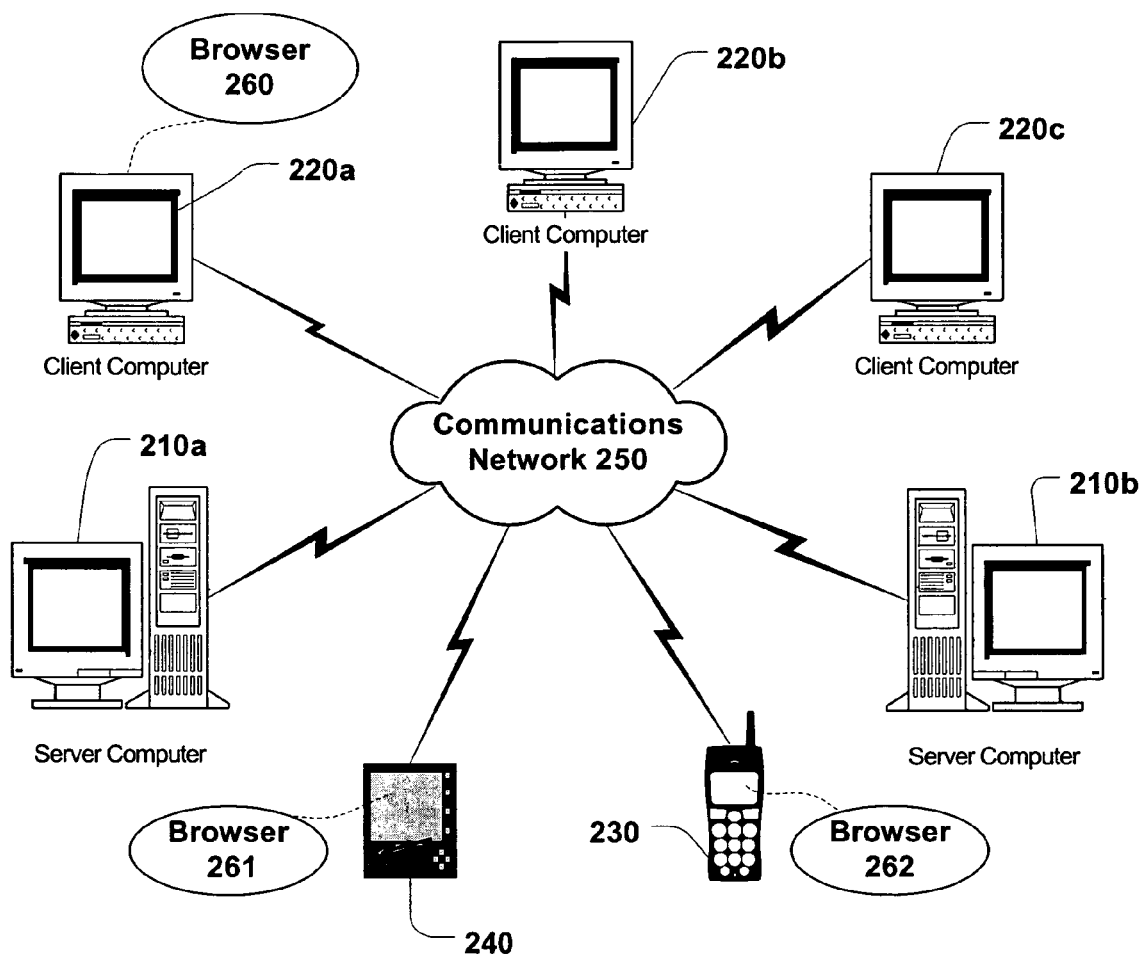
FIG. 2 is a diagram of an exemplary computing network environment and an illustrative system for transformer testing, in accordance with an embodiment of the invention.

Computer 120*a*, described above, can be deployed as part of a computer network. In general, the description for computers may apply to both server computers and client computers deployed in a network environment. FIG. 2 illustrates an exemplary network environment having server computers in communication with client computers, in which systems and methods for transformer testing may be implemented. As shown in FIG. 2, a number of server computers 210*a*, 210*b*, etc., are interconnected via a communications network 250 with a number of client computers 220*a*, 220*b*, 220*c*, etc., or other computing devices, such as, a mobile phone 230, and a personal digital assistant 240. Communication network 250 may be a wireless network, a fixed-wire network, a local area network (LAN), a wide area network (WAN), an intranet, an extranet, the Internet, or the like. In a network environment in which the communications network 250 is the Internet, for example, server computers 210 can be Web servers with which client computers 220 communicate via any of a number of known communication protocols, such as, hypertext transfer protocol (HTTP), wireless application protocol (WAP), and the like. Each client computer 220 can be equipped with a browser 260 to communicate with server computers 210. Similarly, personal digital assistant 240 can be equipped with a browser 261 and mobile phone 230 can be equipped with a browser 262 to display and communicate data and information.

In operation, the user may interact with computing application 180 to assist transformer testing, as described above. The generated predictions, suggestions, and questions may be stored on server computers 210, client computers 220, or other client computing devices. The generated predictions, suggestions, and questions may be communicated to users via client computing devices, client computers 220, or the like.

Thus, knowledge-based systems and methods for transformer testing can be implemented and used in a computer network environment having client computing devices for accessing and interacting with the network and a server computer for interacting with client computers. The knowledge-based systems and methods can be implemented with a variety of network-based and standalone architectures, and thus should not be limited to the examples shown.

Knowledge-based systems (e.g., an expert system) typically include a database of knowledge (e.g., models, facts, rules, and the like) that are used by a computing engine (e.g., an inference engine) to emulate the decision-making ability of a human expert. This database of knowledge, in conjunction with the computing engine, may assist a user (not shown) in solving a particular problem. A knowledge-based system may be implemented with a commercially available expert system, which is one type of knowledge-based system, or any other commercially available or custom developed knowledge-based system.

Figure 3:
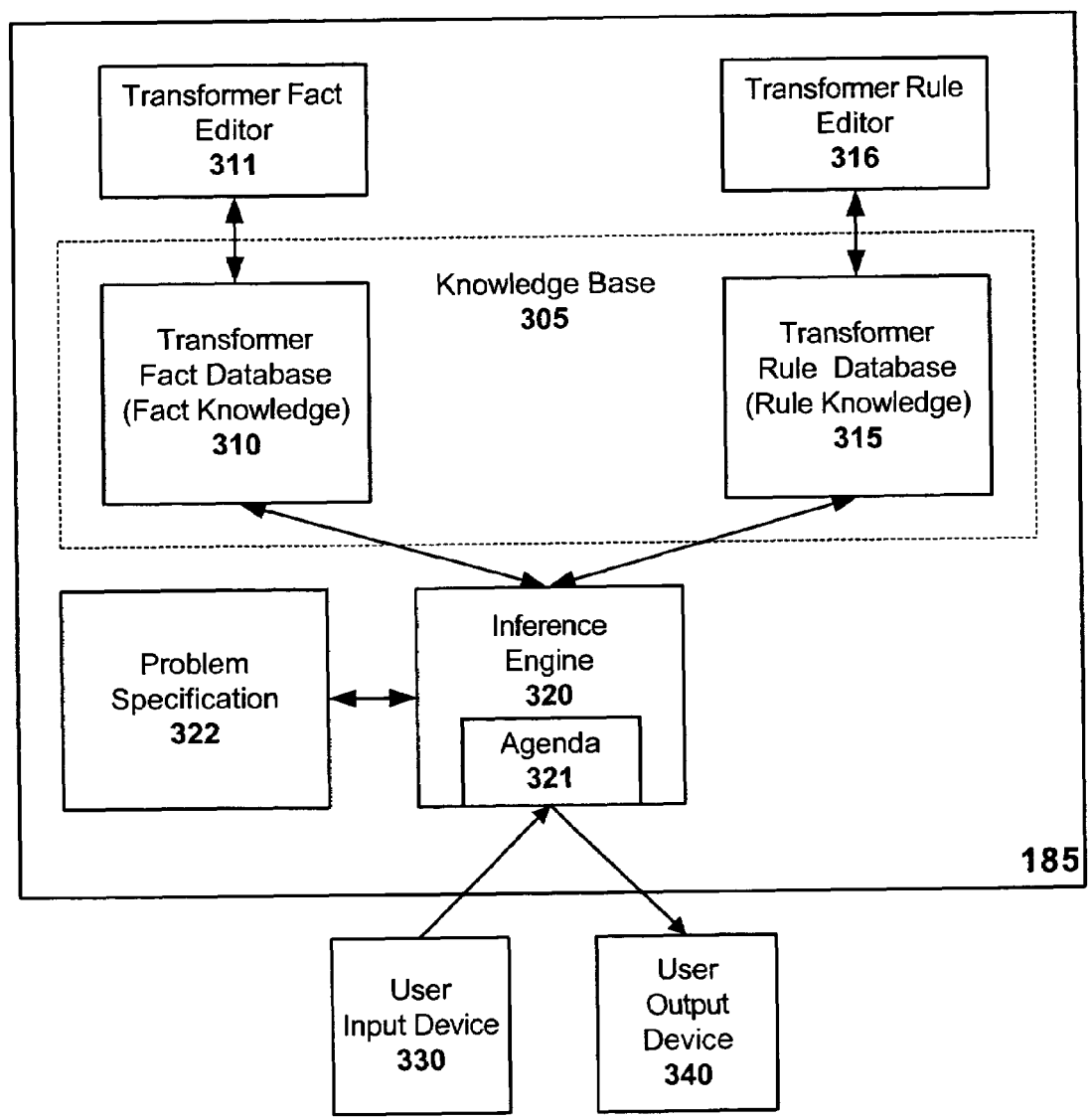
FIG. 3 is a diagram of an illustrative system for transformer testing, illustrating further details of the system of FIG. 1, in accordance with an embodiment of the invention.

FIG. 3 shows an illustrative system 300 for use in transformer testing. As shown in FIG. 3, system 300 may include knowledge-based system 185, user input device 330 (e.g., interface and processing unit 120*a*"), and user output device 340 (e.g., computing application display 181). Knowledge-based system 185 may include an inference engine 320 and a knowledge base 305. While knowledge-based system 185 is shown as being implemented with a single inference engine 320, knowledge-based system 185 may be implemented in any number of engines. Further, the various functionalities of knowledge-based system 185 may be distributed among various engines in any convenient fashion. Knowledge-based system 185 may help a user troubleshoot test failures on a transformer determined from a test taken during transformer manufacture.

Knowledge base 310 may include a transformer fact database 310 and a transformer rule database 315. While knowledge base 305 is shown as being implemented with two databases, knowledge base 305 may be implemented in any number of databases. Further, the various data and information within knowledge base 305 may be distributed among various databases in any convenient fashion. Moreover, the data and information in knowledge base 305 may be stored in any convenient manner, such as, for example, in a multidimensional database, a relational database, tables, data structures, an analytical database, an operational database, a hybrid database, a text file, and the like.

Knowledge base 305 may include both facts and rules. For example, as shown in FIG. 3, knowledge base 305 includes a transformer fact database 310, which represents factual knowledge associated with existing built transformers. Knowledge base 305 may also include a transformer rule database 315, which represents rules associated with transformers, described in more detail below. Transformer fact database 310 may have an associated transformer fact editor 311 to allow a user to edit transformer fact database 310. Transformer rule database 315 may have an associated transformer rule editor 316 to allow a user to edit transformer rule database 315.

FIG. 4 shows more details of transformer fact database 310. As shown in FIG. 4, transformer fact database 310 may include various information 450–480. The information 450–480 may be stored in computing application processing and storage area 182. Alternatively, information 450–480 may be stored in client computer 220*a*, server computer 210*a*, or the like. Information 450–480 may be stored in any convenient manner, such as, for example, in a multidimensional database, a relational database, tables, data structures, an analytical database, an operational database, a hybrid database, a text file, and the like.

As shown in FIG. 4, transformer fact database 310 may include built transformer design specification information 450, built transformer as-built information 460, built transformer measured test information 470, and built transformer manufacture information 480. Built transformer design specification information 450, includes information representative of the design parameters of the built transformer. For example, built transformer design specification information 450 may include, for example, the designed power rating of the built transformer, the specifications of the conductor that was designed to be used in the transformer, the specifications of the core that was designed to be used in the transformer, dimensions found on engineering drawings (e.g., lengths, widths, and thicknesses of the various parts of a transformer), the number of layers of metal and insulating material in the core, the type of insulating material, the total weight of the core, the amount and type of oil, special instructions like how much torque to use to tighten bolts, and the like. Alternatively, design specification information 450 may include an indication of a power transformer design type, and an indication of a power transformer design revision, and the like, which allow knowledge-based system 185 to determine the design specification information (e.g., via another data table, database, or the like). In such an alternative embodiment, knowledge-based system 185 may communicate with a database containing the built transformer design specification information based on the indication of design type, design revision, and the like. In this manner, less data storage may be occupied by built transformer design specification information 450.

Built transformer as-built information 460 includes information representative of the as-built parameters (which may or may not be the same as the design specification) of the built transformer. For example, built transformer as-built information 460 may include the specifications of the actual conductor that was installed in the transformer, the specification of the actual core that was installed in the transformer, lot numbers of all materials used in the manufacture of a transformer, the names of the suppliers, the cost of the materials, the results of any quality control tests performed on those materials (e.g., the measure of specific gravity of the oil used in a transformer), and the like.

Built transformer measured test information 470 includes information representative of information measured from tests of the built transformer. For example, built transformer measured test information 470 may include, for example, a load loss measured from the built transformer, a temperature measured from the built transformer, the results of an impulse test measured from the built transformer, pressure rise, oil rise, top of unit oil temperature, top oil temperature, top oil rise, top oil measured, average oil rise, max oil rise, gradient temperature at tested current, average duct temperature rise, winding temperature rise, resistance, ratio, polarity, instrumentation loss, shorting bar loss, impedance, eddies and strays, root-mean-square (rms) amps, rms watts, voltage, and the like. Many of these measurements may be made several times with the transformer exposed to different conditions (e.g., different ambient temperatures, different applied current, etc.). The measured test information may include actual measured value and values calculated from the actual measured values.

Built transformer manufacture information 480 includes information representative of the manufacture of the built transformer. For example, built transformer manufacture information 480 may include an indication of a winding machine used in the manufacture of the built transformer, an indication of the last date and time that the winding machine was calibrated, an indication of a core cutting machine used in the manufacture of the built transformer, an indication of the last date and time that the cutting machine was retooled, environmental parameters experienced during manufacture (e.g., barometric pressure, temperature, and humidity), and the like. This information 450–480 includes facts that may be used by knowledge-based system 185 to help a user troubleshoot a test failure of a transformer.

The built transformers may be of different designs, may be of different power ratings, may have been built in different manufacturing plants, may have been built using different manufacturing equipment, may have been built using different materials, and the like. The information 450–480 may be pre-assembled into a database for access by knowledge-based system 185. The information 450–480 may be appended with information from each newly built transformer.

Returning now to FIG. 3, transformer rule database 315 may include rules about transformers that have been developed with the assistance of a transformer expert, described in more detail below. The rules may be in the form of antecedent-consequent, if-then statements, and the like. The rules are typically intended to reflect "rules of thumb" that experts use in their day-to-day work. These "rules of thumb" are also referred to as heuristics.

Development of such rules for transformer rule database 315 typically includes having a knowledge-based system developer work with an expert to learn enough about the relevant task. The expert typically is a human who is identified as being an expert in a particular field. Rule development may, however, include expertise learned from multiple experts. For example, a transformer designer may have expertise in transformer design but not have expertise in transformer manufacture. A production engineer may have great experience with the manufacture of transformers or with a new piece of transformer production equipment. In such a case, two or more experts may collaborate to develop rules to model the experts knowledge of transformers. The developer and the expert(s) may discuss previous transformer troubleshooting events, current transformer troubleshooting events, and hypothetical transformer troubleshooting events in developing the rules. Thus, transformer rule database 315 may include rules corresponding to transformer design and rules corresponding to transformer production and manufacturing.

Development of knowledge base 305 may include the acquisition of strategic knowledge, judgmental knowledge, and factual knowledge. Strategic knowledge may be used to create a flow chart of the system. Judgmental knowledge may be used to define the inference process and describe the reasoning process used by the expert. Factual knowledge describes the characteristics and important attributes of the transformer and other relevant information. In this manner, a database of knowledge may be developed that allows a computing engine, an inference engine, or the like, to make inferences, predictions, suggestions, and the like.

Inference engine 320 uses the data and information in knowledge base 305 to determine a predicted root cause of a transformer test failure and a suggestion for addressing the test failure. Inference engine 320 may include an agenda 321, described in more detail below. Inference engine 320 may also interface with a problem specification 322 which may be used to store information about the problem that knowledge-based system 185 is trying to solve.

Problem specification 322 may store information received from user input device 330 (which may include test results, answers to questions, and the like) and defines a problem to be solved by knowledge-based system 185. Alternatively, relevant information may be received in problem specification 322 from other computing devices, for example, test results may be downloaded directly from a transformer testing device (not shown), and the like. Problem specification 322 may continue to receive and store more and more information as the problem becomes better defined, for example, by receiving additional test results, by receiving answers to questions about the failed transformer, and the like, described in more detail below.

To interface with a user, knowledge-based system 185 may receive information from user input device 330. User input device 330 may receive information input by a user into interface and processing unit 120*a*", browsers 260–262, and the like. User input device 330 may receive transformer test results, answers to questions, and the like. User input device 330 may also receive power transformer manufacture information, such as, for example, a particular winding machine used to wind the core, and the like. Such information may also be communicated to knowledge-based system 185 via other computing devices, such as, for example, bar code readers, transformer test equipment, and the like.

Inference engine 320 may control the overall execution of the rules (e.g., expert system rules) and the application of factual data to the problem. Inference engine 320 attempts to model the reasoning that would be performed by an expert or experts faced with the same problem. Inference engine 320 may search transformer fact database 310 and transformer rule database 315 and attempt to pattern match facts or knowledge in problem specification 322 to antecedents of rules of transformer rule database 315.

If a rule's antecedent is satisfied, the rule may be executed but is typically first placed in agenda 321. The agenda 321 tracks rules that may be executed and allows the rules to be prioritized, such that the highest priority rules are executed first. In effect, agenda 321 provides a 'scratch-pad' for inference engine 320 to list and analyze various rules to determine which rule is most likely to provide beneficial results.

Rules may be executed by inference engine 320 in a forward chain or a backward chain, or in some combination thereof. In forward chaining, knowledge-based system 185 receives information and data (specifying a problem) and then chains forward to reach a conclusion based on the problem specification and the knowledge base 305. In forward chaining, the user begins by entering specifics of a problem into the knowledge-based system 185 (which gets stored in problem specification 322). Generally, with forward chaining, the more information received into problem specification 322, the better the conclusion reached by inference engine 320. Inference engine 320 inspects problem specification 322 and then looks for rules and data that will help it form a conclusion, such as a predicted root cause of the transformer failure and a suggestion to address the failure. Inference engine 320 may suggest that another test be performed to provide more information into problem specification 322 and thereby provide more details for inference engine 320 to analyze.

In backward chaining, the knowledge-based system generates a hypothesis and backtracks to check if the hypothesis is valid. For example, inference engine 320 may first analyze a Rule #2 (because its consequent contains the hypothesis or conclusion that inference engine 320 is trying to prove), then at a Rule #1 (because its consequent matches a statement from Rule #2's antecedent), thus the term backward chaining. When inference engine 320 determines that some information isn't in knowledge base 305 or problem specification 322, inference engine 320 may generate a question for the user (question-answer type of user interaction typifies backward-chaining systems). The user's answers become part of the problem specification 322 (and possibly knowledge base 305).

In making inferences, inference engine 320 may face uncertainties, for example, inference engine 320 may determine that both a first solution and a second solution may be valid solutions to a particular problem specification. Because real life problems typically do not have absolute certain solutions, knowledge-based system 185 may include features for addressing such uncertainty. The uncertainty may be addressed using, for example, certainty factors, Dempster-Shafer Theory, a Bayesian Network, fuzzy logic, and the like. Certainty factors may be used as a degree of confirmation of a piece of factual evidence. Mathematically, a certainty factor is the measure of belief minus the measure of disbelief. Certainty factors are relatively easy to compute and can be used to easily propagate uncertainty through the system. Dempster-Shafer Theory is similar to a certainty factor but does not require that factors sum to 100 percent. Bayesian Networks are based on Bayes Theorem of the probability that a second event has occurred, given that a first event has occurred.

Fuzzy logic is a mathematical technique for dealing with imprecise data and problems that have many solutions rather than one. Although fuzzy logic may be implemented in digital computers (which are typically binary systems), fuzzy logic works with ranges of values, solving problems in a way that more resembles human logic. Fuzzy logic may be used for solving problems with expert systems and real-time systems that react to an imperfect environment of highly variable, volatile or unpredictable conditions. Fuzzy logic expands on traditional set theory by making membership in a set a matter of degree rather than a yes-no situation.

Inference engine 320 may generate a hypothesis or conclusion using the facts in transformer fact database 310, for example, by correlating data from problem specification 322 with data in transformer fact database 310 and determining if any trends exist, and the like. Inference engine 320 may also test a hypothesis or conclusion using the facts in transformer fact database 310, for example, by correlating data from problem specification 322 with data in transformer fact database 310. After addressing uncertainties and analyzing the problem specification 322, inference engine 320 outputs a predicted root cause of the test failure and a suggested course of action to address the test failure.

To interface with a user, knowledge-based system 185 may output the information to user output device 340. User output device 340 may output information to interface and processing unit 120a", browsers 260–262, and the like. User output device 340 may output a predicted root cause for the test failure, a suggested course of action to address the test failure, a question to generate more information for problem specification 322, and the like.

Figure 5:
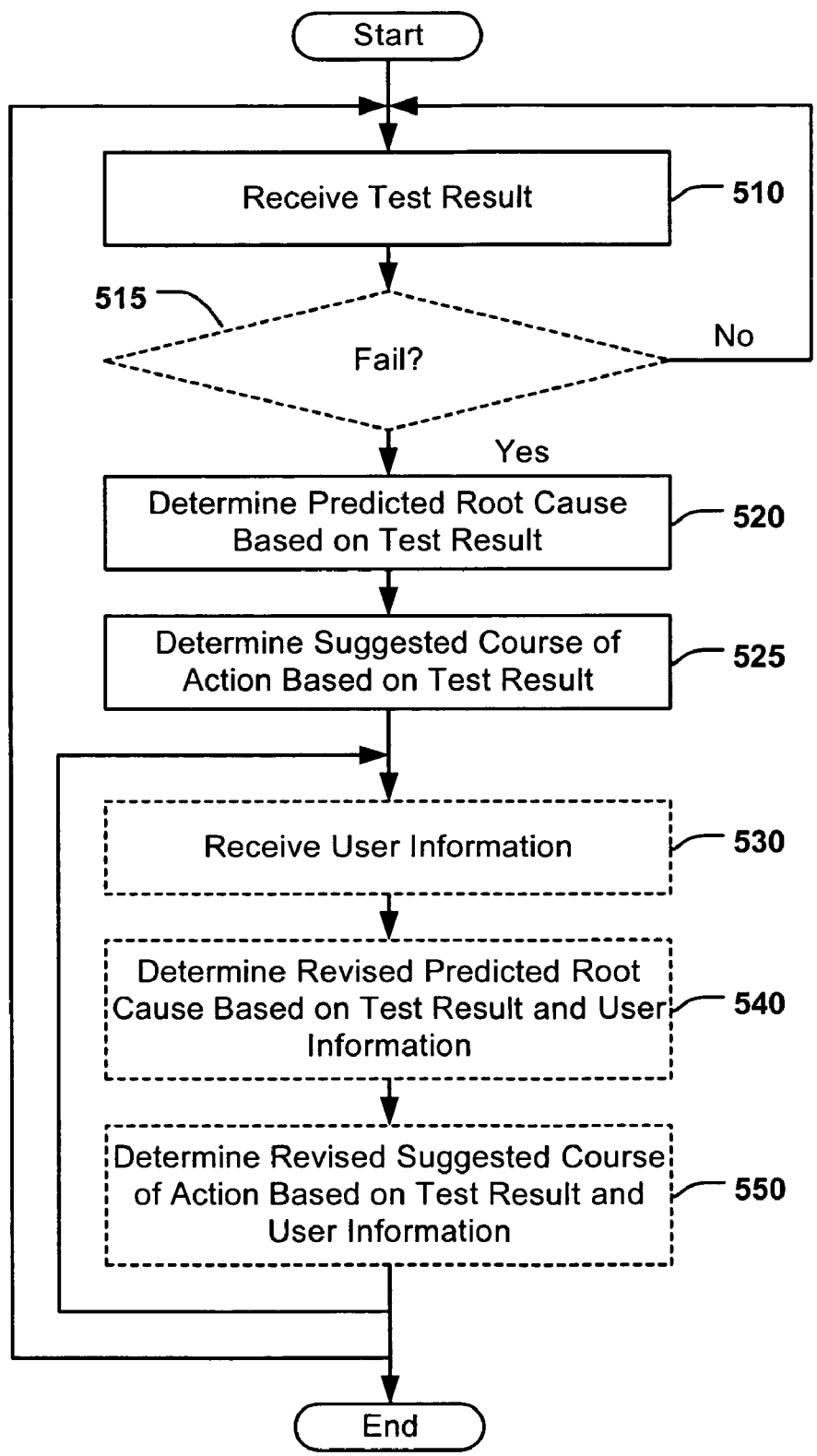
FIG. 5 is a flow diagram of an illustrative method for transformer testing, in accordance with an embodiment of the invention.

FIG. 5 shows a flow chart of an illustrative method 500 for use in transformer testing. While the following description may include references to system 300 of FIG. 3 and computing system 120 of FIG. 1, method 500 may be implemented in a variety of ways, such as, for example, by a single computing engine, by multiple computing engines, via a standalone computing system, via a networked computing system, via other knowledge-based systems, and the like.

As shown in FIG. 5, at step 510, knowledge-based system 185 receives a test result of a transformer. The test result is derived from a test taken on a transformer being manufactured. That is, the transformer has not yet been installed in the field. The transformer may be completely assembled or partially assembled or may only be parts of a transformer ready for assembly into a transformer. The test result may be any test result of transformer, such as, for example, a load loss measured from the built transformer, a temperature measured from the built transformer, the results of an impulse test measured from the built transformer, pressure rise, oil rise, top of unit oil temperature, top oil temperature, top oil rise, top oil measured, average oil rise, max oil rise, gradient temperature at tested current, average duct temperature rise, winding temperature rise, resistance, ratio, polarity, instrumentation loss, shorting bar loss, impedance, eddies and strays, root-mean-square (rms) amps, rms watts, voltage, and the like. The test result may be a passing result or a failing result.

At step 510, knowledge-based system 185 may also store the test result to problem specification 322 for use in compiling a problem specification to be solved (which may be updated as more data and information is received). Also, knowledge-based system 185 may also store the test result to transformer fact database 310 to increase the store of factual knowledge available to inference engine 320 in solving future problems.

At optional step 515, knowledge-based system 185 may also determine if the test result is a passing test result or a failing test result. Knowledge-based system 185 may determine if the test result is a passing test result or a failing test result by comparing the test result to a predefined threshold stored in computing system 120, or the like. If at step 515, knowledge-based system 185 determines that the test result is a passing test result, then method 500 proceeds back to step 510 to receive another test result. If at step 515, knowledge-based system 185 determines that the test result is a failing test result, then method 500 proceeds to step 520. Alternatively, the user may manually determine whether the test result is a passing test result or a failing test result, for example, by comparing the result to a predefined threshold. In such an alternative, knowledge-based system 185 does not execute step 515.

At step 520, knowledge-based system 185 determines a predicted root cause of the test failure based on the test result received at step 510 and knowledge base 305. For example, at step 520, inference engine 320 may read the problem specification 322 (which may now include the test result received at step 510). Inference engine 320 may then determine a predicted root cause of the test failure using forward-chaining. The predicted root cause may include a transformer design-related parameter, a transformer manufacturing-related parameter, or the like. For example, the predicted root cause may be that a piece of manufacturing equipment needs recalibration, needs the blades sharpened, that the humidity in the manufacturing environment is high or low, that the oil storage in the manufacturing facility has too much water content, and the like. Inference engine 320 may make an inference about the root cause of the test failure based on transformer fact database 310 and/or transformer rule database 315. Inference engine 320 may prioritize rules using agenda 321 before executing any rule. In this manner, inference engine 320 may execute a rule that is more likely to generate a reliable predicted root cause.

At step 525, knowledge-based system 185 determines a suggested course of action for the test failure based on the test result received at step 510 and knowledge base 305. For example, at step 525, inference engine 320 may read the problem specification 322 (which may now include the test result received at step 510). Inference engine 320 may then determine a suggested course of action using forward-chaining. Inference engine 320 may make an inference about the suggested course of action based on transformer fact database 310 and/or transformer rules 315. Inference engine 320 may prioritize rules using agenda 321 before executing any rule. In this manner, inference engine 320 may execute a rule that is more likely to generate a reliable suggested course of action. The suggested course of action may include a transformer design-related parameter, a transformer manufacturing-related parameter, or the like. The suggested course of action may be a suggestion to repair or rework the transformer or may be a suggestion to run a different test on the transformer (or to rerun the same test on the transformer), to perform a check on the test equipment and redo the test, and the like. For example, the suggested course of action may be to recalibrate a piece of manufacturing equipment, to sharpen the blades on a piece of manufacturing equipment, to adjust the humidity in the manufacturing environment, to remove water from the oil storage in the manufacturing facility, and the like. Alternatively, the suggested course of action may also be a request for additional information, such as, "What piece of manufacturing equipment was used to manufacture the transformer winding?"

At optional step 530, knowledge-based system 185 may receive user information from user input information 330. For example, knowledge-based system 185 may receive test results from another test run on the failed transformer, may receive the failed transformer's design specification, may receive the failed transformer's as-built information, may receive the failed transformer's manufacturing information, may receive an answer to a question about the transformer, and the like. The user information may be stored in problem specification 322 and in transformer fact database 310, if applicable. The user information may then be used by knowledge-based system 185 to refine the root cause prediction and the suggested course of action, now that knowledge-based system 185 has more information to analyze.

At optional step 540, knowledge-based system 185 determines a revised predicted root cause of the test failure based on the test result, knowledge base 305, and the user information from step 530. For example, at step 540, inference engine 320 may read the problem specification 322 (which now includes the user information received at optional step 530). Inference engine 320 may then determine a revised predicted root cause of the test failure using forward-chaining. The revised predicted root cause may include a transformer design-related parameter, a transformer manufacturing-related parameter, or the like. Inference engine 320 may make an inference about the revised root cause prediction failure based on transformer knowledge base 305 and problem specification 322. Inference engine 320 may prioritize rules using agenda 321 before executing any rule.

At optional step 550, knowledge-based system 185 determines a revised suggested course of action for the test failure based on the test result, knowledge base 305, and the user information from step 530. For example, at step 550, inference engine 320 may read the problem specification 322 (which now includes the user information received at step 530). Inference engine 320 may then determine a revised suggested course of action using forward-chaining. The revised suggested course of action may include a transformer design-related parameter, a transformer manufacturing-related parameter, or the like. Inference engine 320 may make an inference about the revised suggested course of action based on knowledge base 305 and problem specification 322. Inference engine 320 may prioritize rules using agenda 321 before executing any rule.

Method 500 may then return to step 510 to receive an additional test result to be added by inference engine 320 to problem specification 322 or may return to step 530 to receive additional user information, such as, for example, an answer to a question. Method 500 may continue looping through the steps until achieving a confidence greater than a predefined confidence or until the user is satisfied that the predicted root cause and suggested course of action are adequate. Knowledge-based system 185 may also output an indication of a confidence in the solution (e.g., a predicted root cause and a suggested course of action) along with the solution to give the user in indication of the reliability of the solution. Knowledge-based system 185 may also wait until a predefined certainty is achieved before outputting the solution so that a user does not have to review solutions with low certainties.

Moreover, method 500 may execute steps 520–550 even if the test result is a passing test result. In this manner, method 500 may determine a predicted root cause of a imminent failure and determine a suggested course of action prior to an actual test failure. For example, upon receiving a series of test results for a no load loss test that are steadily growing (away from what it expected), the method may determine that core cutting blades are dulling. In this manner, the method may recognize a problem before a defective product is actually produced, rather than looking for the problem once a defective product has been built and failed a test. Thus, the systems and methods may also act in a proactive manner (e.g., driven by detecting trends in passing tests).

Figure 6:
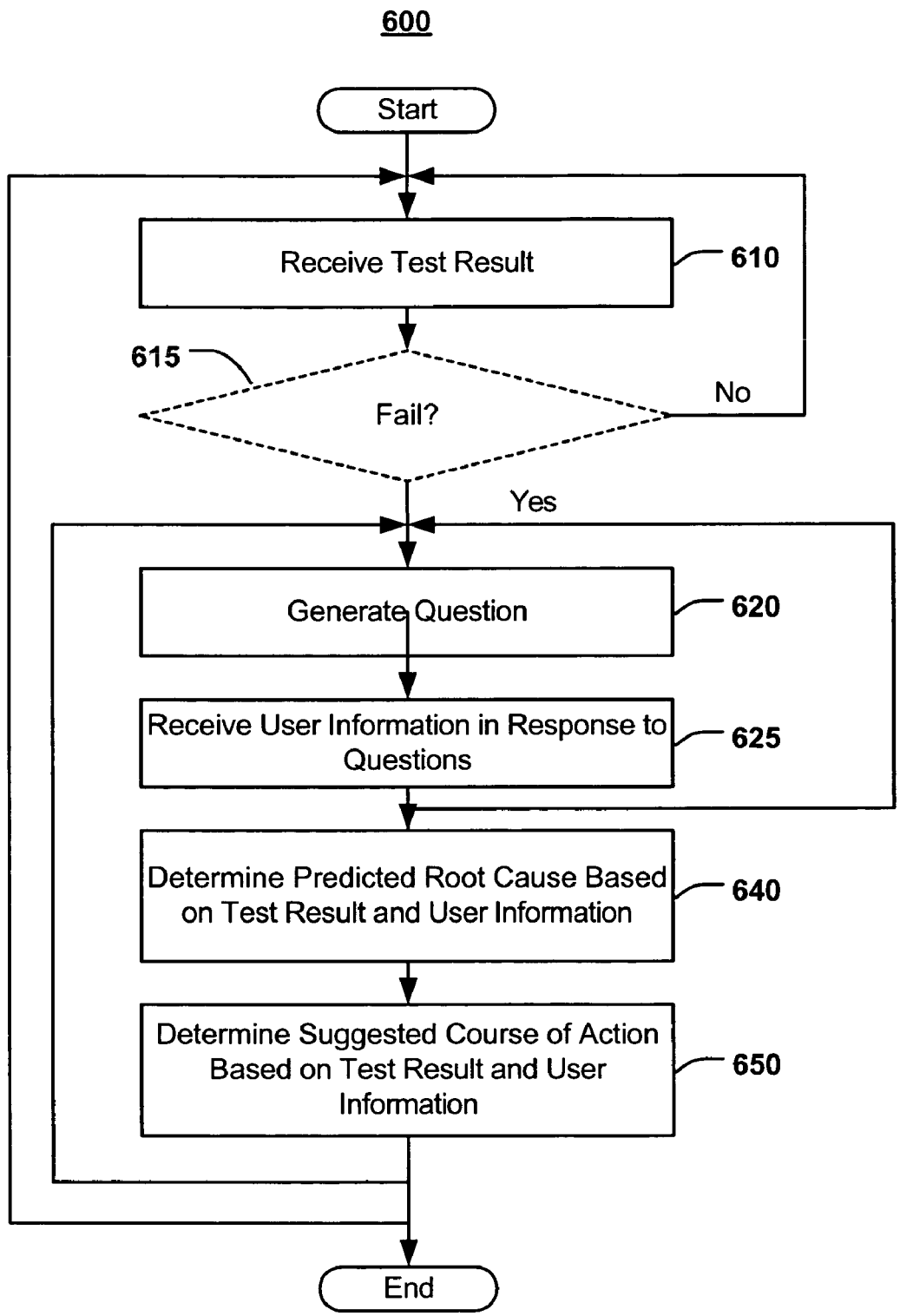
FIG. 6 is a flow diagram of another illustrative method for transformer testing, in accordance with an embodiment of the invention.

If the inference engine 320 is using backward chaining, method 600 of FIG. 6 may be implemented. FIG. 6 shows a flow chart of another illustrative method 600 for transformer testing. While the following description may include references to system 300 of FIG. 3 and computing system 120 of FIG. 1, method 600 may be implemented in a variety of ways, such as, for example, by a single computing engine, by multiple computing engines, via a standalone computing system, via a networked computing system, via other knowledge-based systems, and the like.

As shown in FIG. 6, at step 610, knowledge-based system 185 receives a test result of a transformer. The test result is derived from a test taken on a transformer being manufactured. That is, the transformer has not yet been installed in the field. The transformer may be completely assembled or partially assembled or may only be parts of a transformer ready for assembly into a transformer. The test result may be any test result of transformer test.

At step 610, knowledge-based system 185 may also store the test result to problem specification 322 for use in compiling a problem specification to be solved (which may be updated as more data and information is received). Also, knowledge-based system 185 may also store the test result to transformer fact database 310 to increase the store of factual knowledge available to inference engine 320 in solving future problems.

At optional step 615, knowledge-based system 185 may also determine if the test result is a passing test result or a failing test result. Knowledge-based system 185 may determine if the test result is a passing test result or a failing test result by comparing the test result to a predefined threshold stored in computing system 120, or the like. If at step 615, knowledge-based system 185 determines that the test result is a passing test result, then method 600 proceeds back to step 610 to receive another test result. If at step 615, knowledge-based system 185 determines that the test result is a failing test result, then method 600 proceeds to step 620. Alternatively, the user may manually determine whether the test result is a passing test result or a failing test result, for example, by comparing the result to a predefined threshold. In such an alternative, knowledge-based system 185 does not execute step 615.

At step 620, knowledge-based system 185 determines and displays a question for the test failure based on the test result received at step 610 and knowledge base 305. For example, at step 620, inference engine 320 may read the problem specification 322 (which may now include the test result received at step 610). Inference engine 320 may then determine and display questions to the user, as is typical with backward-chaining. The question may include a transformer design-related parameter, a transformer manufacturing-related parameter, or the like, such as, "What piece of manufacturing equipment was used to manufacture the transformer winding?"

At step 625, knowledge-based system 185 receives user information in response to the question generated at step 620. For example, knowledge-based system 185 may receive an answer to the question about the transformer. Knowledge-based system 185 may receive test results from another test run on the failed transformer, may receive the failed transformer's design specification, may receive the failed transformer's as-built information, may receive the failed transformer's manufacturing information, and the like, in response to the question. The user information may be stored in problem specification 322 and in transformer fact database 310, if applicable. The user information may then be used by knowledge-based system 185 to determine a root cause prediction and a suggested course of action, now that knowledge-based system 185 has more information to analyze the problem.

At this point, method 600 may return to step 620 and ask another question. Method 600 may repeat this until receiving enough information to make a prediction about the root cause and a suggestion for addressing the cause. In this manner, the inference engine 320 can collaborate with a user to help the user troubleshoot transformer test failures.

For example, at step 640, knowledge-based system 185 determines a predicted root cause of the test failure based on the test result, knowledge base 305, and the user information from step 625. For example, at step 640, inference engine 320 may read the problem specification 322 (which may now include the user information received at step 625). Inference engine 320 may then determine a predicted root cause of the test failure. The predicted root cause may include a transformer design-related parameter, a transformer manufacturing-related parameter, or the like. Inference engine 320 may make an inference about the root cause prediction failure based on transformer knowledge base 305 and problem specification 322.

At step 650, knowledge-based system 185 determines a suggested course of action for the test failure based on the test result, knowledge base 305, and the user information from step 625. For example, at step 650, inference engine 320 may read the problem specification 322 (which may now includes the user information received at step 625). Inference engine 320 may then determine a suggested course of action. The suggested course of action may include a transformer design-related parameter, a transformer manufacturing-related parameter, additional questions for the user, additional tests for the user to run on the transformer, and the like. Inference engine 320 may make an inference about the suggested course of action based on knowledge base 305 and problem specification 322.

Method 600 may then return to step 610 to receive an additional test result to be added by inference engine 320 to problem specification 322 or may return to step 625 to receive additional user information, such as, for example, an answer to a question. Method 600 may continue looping through the steps until achieving a confidence greater than a predefined confidence or until the user is satisfied that the predicted root cause and suggested course of action are adequate. Knowledge-based system 185 may also output an indication of a confidence in a solution (e.g., a predicted root cause and a suggested course of action) along with the solution to give the user an indication of the reliability of the solution. Knowledge-based system 185 may also wait until a predefined certainty is achieved before outputting the solution so that a user does not have to receive or review solutions with low certainties.

As such, a user can perform analysis on a failed transformer to determine and distinguish between manufacturing-related variances and design-related variances. The user can also determine which repairs, recalibrations, and the like, may be likely to remedy the test failure. The suggestion may be directed to meeting a final transformer performance goal or specification rather than simply passing the test. For example, if the failed test is not a direct measure of a transformer performance specification (but may affect the performance specification), it may be desirable to allow the test to remain failed, but to modify the transformer in some other area to compensate for the failure (and still meet the performance specification). Alternatively, the user's goal may be to convert each test to a passing result. In either event, the user can use the system to help achieve the desired result. As can be seen, the above described systems and methods provide a technique for testing transformers that enables a designer or manufacture to recover more quickly from problems occurring during the manufacture of a transformer.

Program code (i.e., instructions) for performing the above-described methods may be stored on a computer-readable medium, such as a magnetic, electrical, or optical storage medium, including without limitation a floppy diskette, CD-ROM, CD-RW, DVD-ROM, DVD-RAM, magnetic tape, flash memory, hard disk drive, or any other machine-readable storage medium, wherein, when the program code is loaded into and executed by a machine, such as a computer, the machine becomes an apparatus for practicing the invention. The invention may also be embodied in the form of program code that is transmitted over some transmission medium, such as over electrical wiring or cabling, through fiber optics, over a network, including the Internet or an intranet, or via any other form of transmission, wherein, when the program code is received and loaded into and executed by a machine, such as a computer, the machine becomes an apparatus for practicing the above-described processes. When implemented on a general-purpose processor, the program code combines with the processor to provide an apparatus that operates analogously to specific logic circuits.

It is noted that the foregoing description has been provided merely for the purpose of explanation and is not to be construed as limiting of the invention. While the invention has been described with reference to illustrative embodiments, it is understood that the words which have been used herein are words of description and illustration, rather than words of limitation. Further, although the invention has been described herein with reference to particular structure, methods, and embodiments, the invention is not intended to be limited to the particulars disclosed herein; rather, the invention extends to all structures, methods and uses that are within the scope of the appended claims. Those skilled in the art, having the benefit of the teachings of this specification, may effect numerous modifications thereto and changes may be made without departing from the scope and spirit of the invention, as defined by the appended claims.

What is claimed:

1. A method for transformer testing, comprising:
   receiving a failing test result of a transformer, the test result being determined from a test taken during transformer manufacture;
   determining, via a knowledge-based system, a predicted root cause of the failure based on the test result and a knowledge base of transformer information; and
   determining, via the knowledge-based system, a suggested course of action for the failure based on the test result and the knowledge base of transformer information; and wherein:
   the knowledge base of transformer information comprises a transformer rule;
   determining the predicted root cause comprises determining the predicted root cause based on the test result, the knowledge base of transformer information and the transformer rule; and
   determining the suggested course of action comprises determining the suggested course of action based on the test result, the knowledge base of transformer information, and the transformer rule.

2. The method as recited in claim 1, wherein:
   the knowledge base of transformer information further comprises a transformer fact data;
   determining the predicted root cause comprises determining the predicted root cause based on the test result, the knowledge base of transformer information, the transformer rule, and the transformer fact data; and
   determining the suggested course of action comprises determining the suggested course of action based on the test result, the knowledge base of transformer information, the transformer rule, and the transformer fact data.

3. The method as recited in claim 2, wherein:
   the transformer fact data comprises information representative of a plurality of built transformers, the built transformer information comprising a design specification for each built transformer, and measured test results for each built transformer; and
   determining the predicted root cause comprises determining the predicted root cause based on the test result, the knowledge base of transformer information, the transformer rule, and the transformer fact data, the design specification for each built transformer, and the measured test results for each built transformer; and
   determining the suggested course of action comprises determining the suggested course of action based on the test result, the knowledge base of transformer information, the transformer rule, and the transformer fact data, the design specification for each built transformer, and the measured test results for each built transformer.

4. The method as recited in claim 3, wherein determining the predicted root cause comprises correlating the test result with the plurality of measured test results for each built transformer.

5. The method as recited in claim 3, wherein determining the suggested course of action comprises correlating the test result with the plurality of measured test results for each built transformer.

6. The method as recited In claim 2, wherein:
   the transformer fact data comprises Information representative of a plurality of built transformers, the built transformer information comprising as-built information for each built transformer, and
   determining the predicted root cause comprises determining the predicted root cause based on the test result, the knowledge base of transformer information, the transformer rule, the transformer fact data, and the as-built Information for each built transformer; and
   determining the suggested course of action comprises determining the suggested course of action based on the test result, the knowledge base of transformer information, the transformer rule, the transformer fact data, and the as-built information for each built transformer.

7. The method as recited in claim 1, wherein:
   the transformer rule comprises a transformer manufacture rule;

determining the predicted root cause comprises determining the predicted root cause based on the test result, the knowledge base of transformer information, the transformer rule, and the transformer manufacture rule; and
determining the suggested course of action comprises determining the suggested course of action based on the test result, the knowledge base of transformer Information, the transformer rule, and the transformer manufacture rule.

8. The method as recited in claim 1, wherein:
the knowledge base of transformer information further comprises a transformer fact the transformer rule comprises a transformer manufacture rule, and the transformer fact comprises transformer manufacture information for a plurality of built transformers;
determining the predicted root cause comprises determining the predicted root cause based on the test result, the knowledge base of transformer Information, the transformer rule including the transformer manufacture rule, and the transformer fact including the transformer manufacture information; and
determining the suggested course of action comprises determining the suggested course of action based on the test result, the knowledge base of transformer information, the transformer rule including the transformer manufacture rule, and the transformer fact including the transformer manufacture information.

9. The method as recited in claim 8, wherein the manufacture information for each built transformer comprises at least one of the group of an indication of a manufacturing plant associated with the built transformer, an indication of a piece of manufacturing equipment associated with the built transformer, an indication of a calibration date of manufacturing equipment associated with the built transformer, and an indication of a retooling date of manufacturing equipment associated with the built transformer.

10. The method as recited in claim 1, wherein the predicted root cause comprises a prediction that a piece of transformer manufacturing equipment is out of calibration.

11. The method as recited in claim 1, wherein the suggested course of action comprises a suggestion to modify a scheduled transformer manufacturing.

12. The method as recited in claim 1, wherein the suggested course of action comprises a suggestion to redo a previously completed transformer manufacturing step.

13. The method as recited in claim 1, wherein the suggested course of action comprises a suggestion to recalibrate a place of transformer manufacturing equipment and to redo a previously completed transformer manufacturing step.

14. The A method for transformer testing, comprising:
receiving a failing teat result of a transformer, the test result being determined from a test taken dump transformer manufacture;
determining, via a knowledge-based system, a predicted root cause of the failure based on the test result and a knowledge base of transformer information;
determining, via the knowledge-based system, a suggested course of action for the failure based on the test result and the knowledge base of transformer information;
receiving, from a user interface, additional information associated with the failed transformer;
determining, via the knowledge-based system, a revised predicted root cause of the failure based on the test result, the knowledge base of transformer information, and the additional information; and
determining, via the knowledge-based system, a revised suggested course of action for the failure based on the test result, the knowledge base of transformer information, and the additional information.

15. The method as recited in claim 14, further comprising repeating receiving the additional information and determining revised predictions and suggestions until meeting a predefined certainty.

16. A system for transformer testing, comprising:
a knowledge base, comprising transformer information; and
an inference engine in communication with the knowledge base, the inference engine being configured to perform:
receiving a failing test result of a transformer, the test result being determined from a test taken during transformer manufacture;
determining a predicted root cause of the failure based on the test result and a knowledge base of transformer information; and
determining a suggested course of action for the failure based on the test result and the knowledge base of transformer information; and
wherein:
the knowledge base of transformer information comprises a transformer rule; and
the inference engine is further configured to perform:
determining the predicted root cause comprises determining the predicted root cause based on the test result, the knowledge base of transformer information, and the transformer rule; and
determining the suggested course of action comprises determining the suggested course of action based on the test result, the knowledge base of transformer information, and the transformer rule.

17. The system as recited in claim 16, wherein:
the knowledge base of transformer information further comprises a transformer fact data;
the inference engine is further configured to perform:
determining the predicted root cause comprises determining the predicted root cause based on the test result, the knowledge base of transformer Information, the transformer rule, and the transformer fact data; and
determining the suggested course of action comprises determining the suggested course of action based on the test result, the knowledge base of transformer information, the transformer rule, and the transformer fact data.

18. The system as recited in claim 17, wherein:
the transformer fact data comprises information representative of a plurality of built transformers, the built transformer information comprising a design specification for each built transformer, and measured test results for each built transformer, and the inference engine is further configured to perform:
determining the predicted root cause comprises determining the predicted root cause based on the test result, the knowledge base of transformer information, the transformer rule, and the transformer fact data, the design specification for each built transformer, and the measured test results for each built transformer; and
determining the suggested course of action comprises determining the suggested course of action based on the test result, the knowledge base of transformer information, the transformer rule, and the transformer fact data, the design specification for each built transformer, and the measured test results for each built transformer.

19. The system as recited in claim 18, wherein the inference engine is further configured to perform correlating the test result with the plurality of measured test results for each built transformer to determine the predicted root cause.

20. The system as recited in claim 18, wherein the inference engine is further configured to perform correlating the test result with the plurality of measured test results for each built transformer to determine the suggested course of action.

21. The system as recited in claim 17, wherein:
the transformer fact data comprises information representative of a plurality of built transformers, the built transformer information comprising as-built information for each built transformer, and
the inference engine is further configured to perform:
determining the predicted rout cause comprises determining the predicted root cause based on the test result, the knowledge base of transformer information, the transformer rule, the transformer fact data, and the as-built information for each built transformer; and
determining the suggested course of action comprises determining the suggested course of action based on the test result the knowledge base of transformer information, the transformer rule, the transformer fact data, and the as-built information for each built transformer.

22. The system as recited in claim 16, wherein:
the transformer rule comprises a transformer manufacture rule; and
the inference engine is further configured to perform:
determining the predicted root cause comprises determining the predicted root cause based on the test result, the knowledge base of transformer information, the transformer rule, and the transformer manufacture rule; and
determining the suggested course of action comprises determining the suggested course of action based on the test result, the knowledge base of transformer information, the transformer rule, and the transformer manufacture rule.

23. The system as recited in claim 16, wherein:
the knowledge base of transformer information further comprises a transformer fact, the transformer rule comprises a transformer manufacture rule, and the transformer fact comprises transformer manufacture information for a plurality of built transformers; and
the inference engine is further configured to perform:
determining the predicted mat cause comprises determining the predicted root cause based on the test result the knowledge base of transformer information, the transformer rule including the transformer manufacture rule, and the transformer fact including the transformer manufacture information; and
determining the suggested course of action comprises determining the suggested course of action based on the test result, the knowledge base of transformer information, the transformer rule including the transformer manufacture rule, and the transformer fact Including the transformer manufacture information.

24. The system as recited in claim 23, wherein the manufacture information for each built transformer comprises at least one of the group of an indication of a manufacturing plant associated with the built transformer, an indication of a piece of manufacturing equipment associated with the built transformer, an indication of a calibration date of manufacturing equipment associated with the built transformer, and an indication of a retooling date of manufacturing equipment associated with the built transformer.

25. The system as recited in claim 16, wherein the inference engine is further configured to perform:
receiving, from a user interface, additional information associated with the failed transformer;
determining a revised predicted root cause of the failure based on the test result, the knowledge base of transformer information, and the additional information; and
determining a revised suggested course of action for the failure based on the test result, the knowledge base of transformer information, and the additional information.

26. The system as recited in claim 25, wherein the inference engine is further configured to perform repeating receiving the additional information and determining revised predictions and suggestions until meeting a predefined certainty.

27. The system as recited in claim 16, wherein the predicted root cause comprises a prediction that a piece of transformer manufacturing equipment is out of calibration.

28. The system as recited in claim 16, wherein the suggested course of action comprises a suggestion to modify a scheduled transformer manufacturing step to compensate for the test failure.

29. The system as recited in claim 16, wherein the suggested course of action comprises a suggestion to redo a previously completed transformer manufacturing step.

30. The system as recited in claim 16, wherein the suggested course of action comprises a suggestion to recalibrate a piece of transformer manufacturing equipment and to redo a previously completed transformer manufacturing step.

* * * * *